(12) United States Patent
Jin et al.

(10) Patent No.: US 7,569,869 B2
(45) Date of Patent: Aug. 4, 2009

(54) TRANSISTOR HAVING TENSILE STRAINED CHANNEL AND SYSTEM INCLUDING SAME

(75) Inventors: Been-Yih Jin, Lake Oswego, OR (US); Robert S. Chau, Beaverton, OR (US); Suman Datta, Beaverton, OR (US); Jack T. Kavalieros, Portland, OR (US); Marko Radosavlievic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 11/729,564

(22) Filed: Mar. 29, 2007

(65) Prior Publication Data
US 2008/0237636 A1    Oct. 2, 2008

(51) Int. Cl.
*H01L 29/737*    (2006.01)
*H01L 29/778*    (2006.01)

(52) U.S. Cl. .................. 257/190; 257/194; 257/288; 257/E29.193; 257/E29.251

(58) Field of Classification Search .......... 257/190, 257/194, 213, 288, E29.193, E29.778
See application file for complete search history.

(56) References Cited

U.S. PATENT DOCUMENTS

| | | | | |
|---|---|---|---|---|
| 5,081,511 A | * | 1/1992 | Tehrani et al. ............. 257/192 |
| 5,298,441 A | * | 3/1994 | Goronkin et al. ........... 438/172 |
| 6,214,656 B1 | * | 4/2001 | Liaw ......................... 438/199 |
| 6,492,216 B1 | * | 12/2002 | Yeo et al. .................... 438/197 |
| 6,583,437 B2 | * | 6/2003 | Mizuno et al. ................ 257/19 |
| 6,607,948 B1 | * | 8/2003 | Sugiyama et al. ........... 438/151 |
| 6,900,521 B2 | * | 5/2005 | Forbes et al. ................ 257/616 |
| 7,211,458 B2 | * | 5/2007 | Ozturk et al. ................. 438/36 |
| 2003/0052348 A1 | * | 3/2003 | Takagi et al. ................ 257/288 |
| 2003/0102498 A1 | * | 6/2003 | Braithwaite et al. ........ 257/288 |
| 2004/0108559 A1 | * | 6/2004 | Sugii et al. .................. 257/411 |
| 2004/0227154 A1 | * | 11/2004 | Chu et al. .................... 257/194 |
| 2007/0052048 A1 | * | 3/2007 | Hoke .......................... 257/431 |
| 2007/0096148 A1 | * | 5/2007 | Hoentschel et al. ......... 257/192 |

* cited by examiner

*Primary Examiner*—Thanh V Pham
*Assistant Examiner*—Duy T Nguyen
(74) *Attorney, Agent, or Firm*—Scott M. Lane; Intel Corporation

(57) ABSTRACT

A transistor structure and a system including the transistor structure. The transistor structure comprises: a substrate including a first layer comprising a first crystalline material; a tensile strained channel formed on a surface of the first layer and comprising a second crystalline material having a lattice spacing that is smaller than a lattice spacing of the first crystalline material; a metal gate on the substrate; a pair of sidewall spacers on opposite sides of the metal gate; and a source region and a drain region on opposite sides of the metal gate adjacent a corresponding one of the sidewall spacers.

15 Claims, 2 Drawing Sheets

TRANSISTOR HAVING TENSILE STRAINED CHANNEL AND SYSTEM INCLUDING SAME

FIELD

Embodiments of the present invention relate generally to the field of transistor fabrication. In particular, embodiments relate to transistor structures adapted to enhance hole mobility.

BACKGROUND

Transistors and other devices are connected together to form circuits, such as very large scale integrated circuits, ultra-large scale integrated circuits, memory, and other types of circuits. When the size of transistors, for example, is reduced and device compaction is increased, problems may arise concerning parasitic capacitance, off-state leakage, power consumption, and other characteristics of a device. Semiconductor on insulator (SOI) structures have been proposed in an attempt to overcome some of these problems. However, SOI structures generally have a high rate of defects, as it is difficult to produce thin, uniform semiconductor layers in fabrication. Defect problems in SOI structures include defects within a single wafer (e.g., the thickness of a wafer differs at various points on the wafer) and defects from wafer to wafer (e.g., an inconsistent mean silicon layer thickness among SOI wafers). As transistor devices are made smaller, channel length is generally reduced. Reduction in the channel length generally results in an increased device speed, as gate delay typically decreases. However, a number of side effects may arise when channel length is reduced. Such negative side effects may include, among others, increased off-state leakage current due to threshold voltage roll-off (e.g., short channel effects).

One way of increasing device speed is to use higher carrier mobility semiconductor materials to form the channel. Carrier mobility is generally a measure of the velocity at which carriers flow in a semiconductor material under an external unit electric field. In a transistor device, carrier mobility is a measure of the velocity at which carriers (e.g., electrons and holes) flow through or across a device channel in an inversion layer. For example, higher carrier mobility has been found in narrow bandgap materials that include germanium (Ge). Germanium has electron and hole mobility of about 3900 cm2/Vs and about 1900 cm2/Vs, respectively, which are higher than that of electron and hole mobility of silicon, which are 1500 cm2/Vs and 450 cm2/Vs, respectively.

Current transistor structures used compressively strained Ge, either on a SiGe graded buffer or on a Si substrate, to enhance hole mobility in Ge pMOSFET devices, where a room temperature hole mobility of about 2100 cm$^2$/Vs had been observed. However, disadvantageously, the hole mobility observed in compressively strained Ge, though much higher than in a conventional Si pMOSFET device, is still not high enough to be compatible with the highest electron mobility achievable from III-V semiconductor materials, such as, for example, InSb (with a electron mobility of about 80,000 cm$^2$/Vs).

The prior art fails to provide a material adapted for use on a transistor substrate and having a higher hole mobility than compressive Ge.

Figure 1:
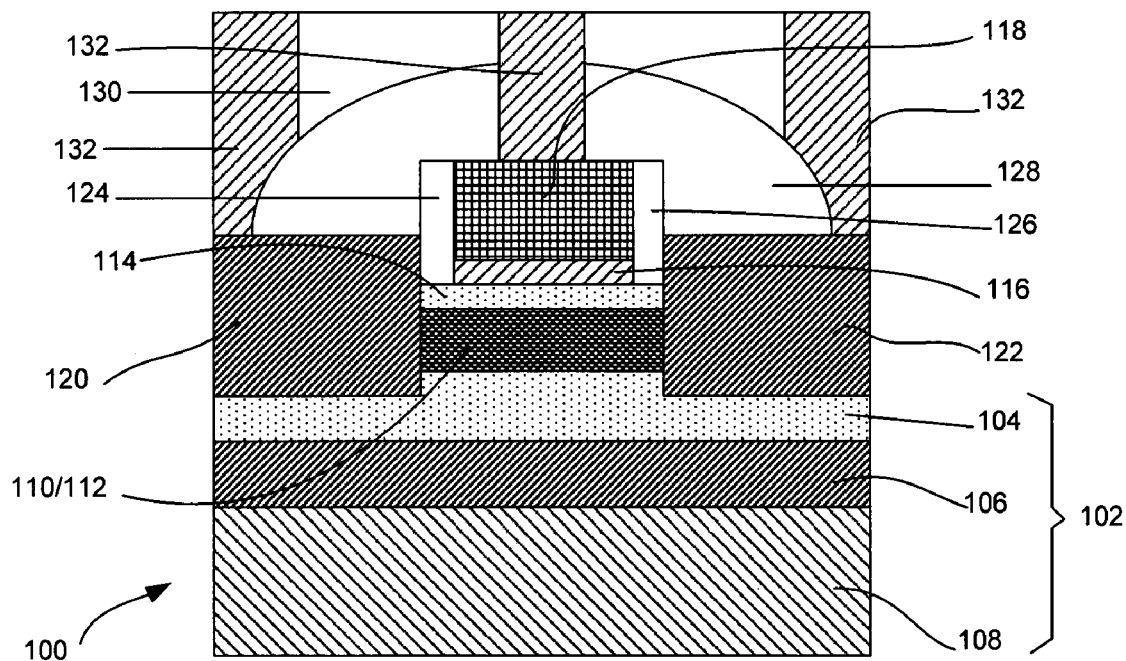
FIG. 1 is a schematic cross-sectional view of a tensile Ge channel MOSFET.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a transistor device including a tensile strained Ge channel, and a system including the transistor device are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B. In addition, a "layer" as used herein may refer to a layer made of a single material, a layer made of a mixture of different components, a layer made of various sub-layers, each sub-layer also having the same definition of layer as set forth above.

Aspects of this and other embodiments will be discussed herein with respect to FIGS. 1-4 below. The figures, however, should not be taken to be limiting, as it is intended for the purpose of explanation and understanding.

Figure 2:
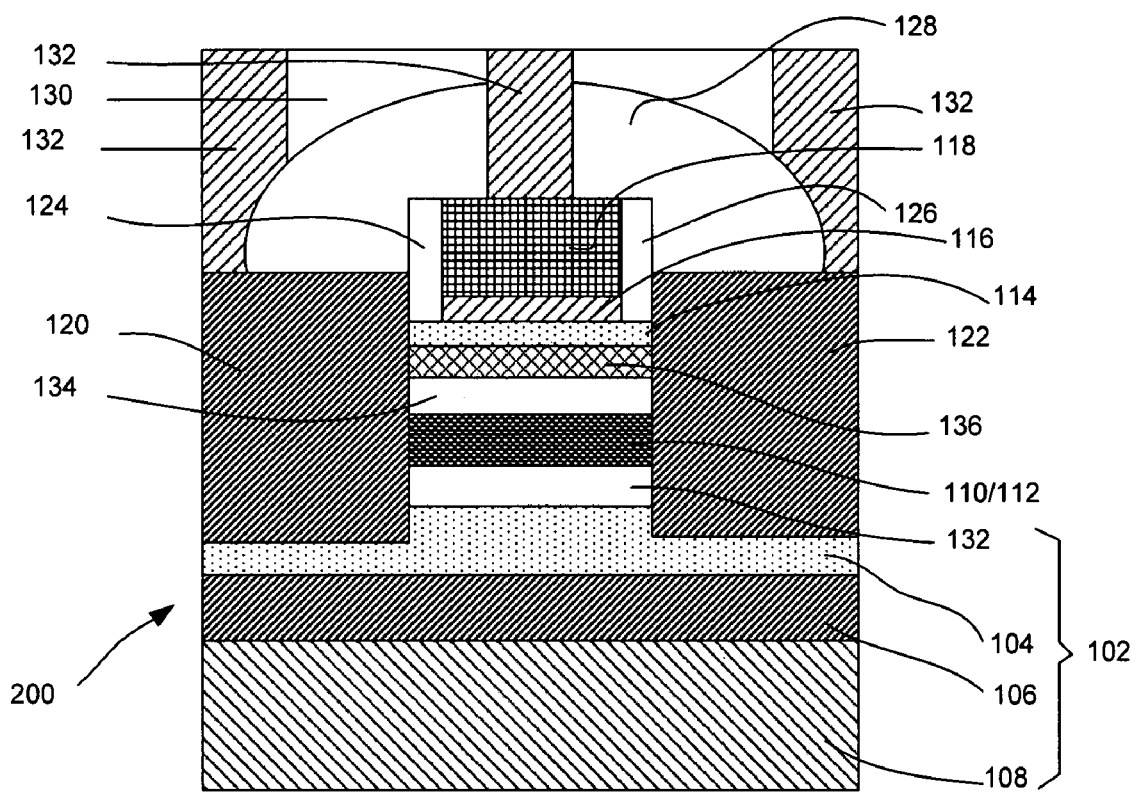
FIG. 2 is a schematic cross-sectional view of a tensile Ge quantum well heterostructure.

According to embodiments, as shown in FIGS. 1 and 2, a transistor structure 100 includes a substrate 102 having a first layer 104 comprising a first crystalline material. Preferably, according to a preferred embodiment, the first crystalline material is a III-V crystalline material, thus making first layer 104 a III-V crystalline layer 104. The crystalline layer 104 may include an epitaxial coherent semi-insulating III-V layer. The crystalline layer 104 may be grown on a graded relaxed III-V buffer layer 106 having varying in-plane lattice spacing, using consecutive heteroepitaxial growth of the III-V compound material groups such as the Al group, the Ga/As/In/Sb group and the Ga/P/In/As group. The Al group may, for example, include at least one of AlSb, AlSbAs, and AlAs, and present lattice spacing varying from about 5.65 Angstroms to about 6.15 Angstroms. The Ga/As/in/Sb group may, for example, include at least one of GaAs, GaInAs, InAs, InAsSb, and InSb, and present a lattice spacing varying from about 5.65 Angstroms to about 6.48 Angstroms. The Ga/P/In/As group may include at least one of GaP, GaInP, InP, InPAs, InAs, and present a lattice spacing varying from about 5.38 Angstroms to about 6.05 Angstroms. The buffer layer 106 may have a continuously varying lattice spacing across its thickness, and can be engineered in a well known manner to reduce the dislocation defect density. The buffer layer may further be disposed on a lower substrate 108, such as one made of Si. A tensile strained channel 110 comprising a second crystalline material may be formed on the surface of the III-V crystalline layer 104. According to embodiments, the second crystalline material has a lattice spacing that is smaller than a lattice spacing of the first crystalline material (of the first layer 104). A difference in the lattice spacings between the first layer 104 and the channel 110 contributes to the tensile straining of the channel. In the shown embodiment, the second crystalline material comprises an epitaxial Ge channel layer. According to a preferred embodiment, the Ge channel layer 112 may present a lattice spacing of about 5.65 Angstroms in its unstrained form (it being understood that the lattice spacing would increase upon tensile straining of the Ge channel layer) and have a thickness below about 300 Angstroms. In the shown embodiment, the tensile strained channel 112 may be under biaxial tensile strain as a result of the effect on the same of the larger lattice spacing of the III-V crystalline layer 104. In particular, the biaxial tensile strain may be by virtue of the global biaxial coherency stress from the III-V crystalline layer 104 due to the lattice constant mismatch between the III-V crystalline layer 104 and the Ge channel layer 112. A tensile strain of the Ge channel layer 112 may thus be engineered according to application needs from 0% strain to about 15% strain, a typical example of a tensile strain of the Ge channel layer 112 according to an embodiment residing between about 1% and about 5%. The provision of the buffer layer 106, III-V crystalline layer 104 and Ge channel layer 112 may be through a growth of each of those layer sequentially in-situ using molecular beam epitaxy, or "MBE" as would be recognized by one skilled in the art.

Referring now in particular to the embodiment of FIG. 1, an embodiment contemplates providing a thin capping layer 114 on the Ge channel layer 112 as a protective sacrificial capping to allow for conventional semiconductor integration processing. Preferably, the capping layer 114 comprises Si grown on the Ge channel layer 112 by well known methods. After provision of the capping layer 114, n and p type active regions (not shown) may be provided using well known implant and isolation methods. Thereafter, as shown in FIG. 1, a high k gate oxide layer 116 (including, for example, $HfO_2$, $ZrO_2$, or any other of the well known high k gate oxide materials) and a metal gate 118 (including, for example, TiN, TaN, or any other of the well known metal gate materials), may be formed on the capping layer 114. According to embodiments, the high k gate oxide layer 116 and metal gate 118 have a work function matched to the tensile strained Ge channel layer 112. After provision of the high k gate oxide layer 116 and of the metal gate 118 (the gate 118 being for example patterned using well known lithography methods), a pair of spacers 124/126 may be formed on each side of the metal gate 118 in a well known manner to isolate the source/drain regions 120/122 from the metal gate 118. After spacer sidewalls are formed, the source/drain areas may be recess etched, and source/drain regions 120/122 may be regrown in recesses thus provided. Preferably, the source/drain regions 120/122 include epitaxially grown Ge or another III-V semiconductor material presenting smaller lattice pacing than the lattice spacing of the channel material. Optionally, a layer of Germanide (not shown) may be formed on top of the source/drain regions 120/122 if the source/drain regions 120/122 comprise Ge. The transistor structure 100 of FIG. 1 further includes a tensile stressed etch stop thin film 128 deposited to introduce uniaxial tensile strain in the Ge channel layer 112. A uniaxial strain in the Ge channel layer 112 may be by virtue of process induced strain exerted by the etch stop thin film 128 as noted above, and/or, it can be effected by inserting a smaller lattice constant material compared to the strained channel 112, such as, for example, p-type doped GaAs, as the material of the source/drain regions 120/122. After provision of the etch stop thin film 128, interlayer dielectric regions 130, contacts 132 and interconnects (not shown) compatible with III-V materials and Ge may be formed in a well known manner.

Referring now in particular to the embodiment of FIG. 2, before provision of the tensile strained channel 110 including a strained Ge channel layer 112, a thin coherent epitaxial lower wide bandgap layer 132 may be grown on the III-V crystalline layer 104, and thereafter be provided with the tensile strained channel 110, such as the strained Ge channel layer 112, in the manner described above. After provision of the Ge channel layer 112, a thin coherent epitaxial upper wide bandgap layer 134 may be grown in the Ge channel layer 112. After provision of the upper wide bandgap layer 134, a remote delta doped layer 136 may be provided thereon in a well known manner, such as through epitaxial growth. The upper wide bandgap layer 134 and lower wide bandgap layer 132 may each have a thickness of, for example, less than 300 Angstroms, other thicknesses being within the purview of embodiments. The upper wide bandgap layer 134 and lower wide bandgap layer 132, along with the delta doped layer 136, provide a band edge energy barrier on the top interface of the strained Ge channel layer 112, effectively confining the carriers in a "quantum well" or "buried quantum well" heterostructure. The capping layer 114, high k gate oxide layer 116, metal gate 118, source/drain regions 120/122, pair of spacers 124/126 and tensile stressed etch stop thin film 128 may be provided for example as set forth with respect to the embodiment of FIG. 1. After provision of the etch stop thin film 128, similar to the embodiment of FIG. 1, interlayer dielectric regions 130, contacts 132 and interconnects (not shown) compatible with III-V materials and Ge may be formed in a well known manner.

Although the description above mentions Ge as a material adapted for use for the tensile strained channel, and a III-V crystalline material for the first crystalline layer, embodiments are not so limited. In fact, embodiments include within their scope of the use of any first crystalline material (of the first crystalline layer) and any second crystalline material (of the channel) that has a lattice spacing smaller than a lattice spacing of the first crystalline material, as recognized by one skilled in the art, such that tensile strain is induced in the channel. For example, embodiments further contemplate the provision of a SiGe material as the material of the tensile strained channel 110, the SiGe material being for example epitaxially provided on an Si substrate. In such a case, the SiGe channel may be a relaxed layer, in the sense that it may not be undergoing biaxial strain from the III-V crystalline layer 104, but it may be uniaxially strained by way of a tensile film, such as the etch stop thin film 128.

Figure 3:
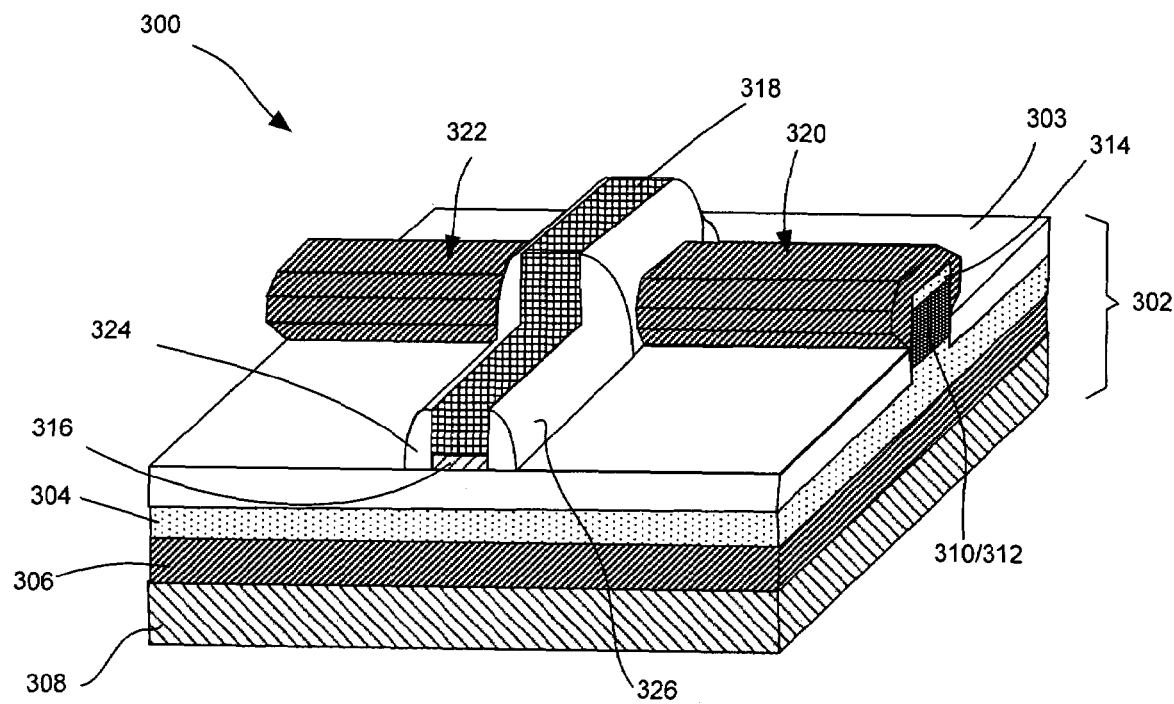
FIG. 3 is a schematic perspective view of a tensile Ge multigate MOSFET.

Referring next to FIG. 3, a tensile strained channel as described above is shown as being part of a multigate MOSFET to further control electrostatics at short channel lengths of cMOSFET devices. Thus, referring now to FIG. 3, an embodiment of a multigate MOSFET structure 300 includes a substrate 302 having a III-V crystalline layer 304. The crystalline layer 304 may include an epitaxial coherent semi-insulating III-V layer. The crystalline layer 304 may be grown on a graded relaxed III-V buffer layer 306 similar to buffer layer 106 of FIGS. 1/2 above, and may further be disposed on a lower substrate 308, such as one made of Si. The substrate 302 may further include an isolation layer 303 thereon. A tensile strained channel 310 may be formed on the surface of the III-V crystalline layer 304, and, in the shown embodiments, comprises an epitaxial Ge channel. According to a preferred embodiment, the Ge channel 312 may present a lattice spacing of about 5.65 Angstroms in its unstrained form (it being understood that the lattice spacing would increase upon tensile straining of the Ge channel layer), and have a height of between about 50 Angstroms to about 300 Angstroms. In the shown embodiment, the tensile strained channel 310 may be under biaxial tensile strain as a result of the effect on the same of the larger lattice spacing of the III-V crystalline layer 304 as described above in relation to Ge channel layer 112 of FIGS. 1/2. The provision of the buffer layer 306, III-V crystalline layer 304 and Ge channel 312 may be through a growth of each of those layer sequentially in-situ using molecular beam epitaxy, or "MBE" as would be recognized by one skilled in the art.

Similar to the embodiment of FIG. 1, an embodiment contemplates providing a thin capping layer 314 on the Ge channel 312 as a protective sacrificial capping. Preferably, the capping layer 314 comprises Si grown on the Ge channel 112 by well of well known methods. Provision of the n and p type active regions (not shown) may be effected using well known implant and isolation methods. As shown in FIG. 3, a high k gate oxide layer 316 (including, for example, $HfO_2$, $ZrO_2$, or any other of the well known high k gate oxide materials) and a metal gate 318 (including, for example, TiN, TaN, or any other of the well known metal gate materials), may be formed on the substrate 302. Source/drain regions 320/322 may further be provided onto the capping layer 314. Preferably, the source/drain regions 320/322 include epitaxially grown Ge or another III-V semiconductor material presenting smaller lattice spacing than the lattice spacing of the channel material. A pair of spacers 324/326 may be formed on each side of the metal gate 318 in a well known manner to isolate the source/drain regions 320/322 from the metal gate 318. Optionally, a layer of Germanide (not shown) may be formed on top of the source/drain regions 320/322 if the source/drain regions 320/322 comprise Ge. A uniaxial strain in the Ge channel layer 312 may be by virtue of inserting a small lattice constant material, such as, for example, p-type doped GaAs as the material of the source/drain regions 320/322. Similar to the embodiment of FIG. 2, the embodiment of FIG. 3 may include a quantum well configuration by virtue of the inclusion of upper and lower wide bandgap spacer layers (not shown) respectively above and below the channel region 310/312.

Similar to the embodiments of FIGS. 1/2, although the description above mentions Ge as a material adapted for use for the tensile strained channel, embodiments are not so limited. For example, embodiments further contemplate the provision of a SiGe material as the material of the tensile strained channel 310, the SiGe material being for example epitaxially provided on an Si substrate. In such a case, the SiGe channel may be a relaxed layer, in the sense that it may not be undergoing biaxial strain from the III-V crystalline layer 304, but it may be uniaxially tensile strained by way of providing source/drain regions having a smaller lattice spacing than a lattice spacing of the SiGe channel.

Advantageously, embodiments used a tensile strained channel to achieve higher hole mobility (for example potentially up to 12,000 cm2/Vs at 1% tensile strain in the Ge case) as compared to a compressively strained Ge channel of the prior art (exhibiting a hole mobility of about 3000 cm2/Vs at 1% compressive strain). A substantial biaxial tensile strain can be introduced in the Ge channel layer through a coherency stress from a larger lattice spacing of the underlying substrate layer, while a substantial uniaxial tensile strain can be process induced through the use of other tensile films on the channel surrounding area. According to a first embodiment, a thin biaxial tensile strained Ge channel, coherently grown on a III-V crystalline layer, and further combining uniaxial strain introduced by a tensile etch stop thin film, is provided. The novel structure provides the following advantages over the prior art: (1) it can achieves a desired tensile strain in the Ge channel by utilizing the local uniaxial and the global biaxial strain to maximize both hole and electron mobility; (2) the substrate layer underlying the Ge channel may be made of a semi-insulating semiconductor compound to isolate the channel and source/drain regions in order to reduce leakage; and (3) the high k/metal gate stack may be readily integrated with the Ge channel. According to a second embodiment, additional thin epitaxially grown layers including upper and lower wide bandgap spacers respectively above and below the channel, a remote delta doping layer can be grown above the upper spacer layer or below the lower spacer layer to provide additional carrier injected into the channel region. Optionally, a Si capping layer can be added on the top of the quantum well stacks as a sacrificial protection layer. The confinement of the holes in the thus formed Ge quantum well advantageously reduces the channel surface roughness scattering, and reduces mobility typically lost as a result of remote Columbic scattering and remote phonon scattering arising from the polar nature of the high k gate oxide layer. In this way, the second embodiment of a strained quantum well structure further enhances hole mobility. A tensile strained channel according to embodiments is further advantageously adapted for use in a multigate MOSFET to further control the electrostatics at short channel length of cMOSFET devices. In addition, where the tensile strained channel includes an uniaxially strained SiGe material allows adaptability of embodiments to both planar and multigated tensile Si Channels in nMOS devices.

Figure 4:
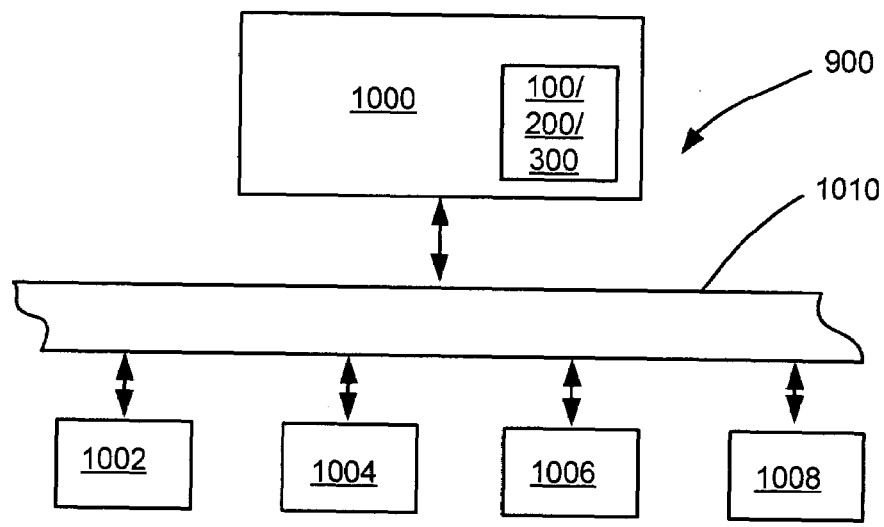
FIG. 4 is a schematic view of an embodiment of a system incorporating a transistor device as shown in either of FIG. 1, 2 or 3.

Referring to FIG. 4, there is illustrated one of many possible systems 900 in which embodiments of the present invention may be used. In one embodiment, the electronic assembly 1000 may include a transistor structure such as any of structures 100, 200 or 300 of FIG. 1, 2 or 3, respectively. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 4, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A transistor structure comprising:
   a substrate including a first layer comprising a first crystalline material;
   a tensile strained channel formed on a surface of the first layer and comprising a second crystalline material having a lattice spacing that is smaller than a lattice spacing of the first crystalline material;
   a capping layer formed on the tensile strained channel;
   a film formed over the capping layer to impart strain to the tensile strained channel;
   a metal gate on the capping layer;
   a pair of sidewall spacers on opposite sides of the metal gate; and
   a source region and a drain region on opposite sides of the metal gate adjacent a corresponding one of the sidewall spacers.

2. The transistor structure of claim 1, wherein the first crystalline material comprises a III-V crystalline material, and the second crystalline material comprises one of Ge and SiGe.

3. The structure of claim 1, further comprising a high-k layer formed on the tensile strained channel, wherein:
   the metal gate is disposed on the high-k layer;
   the channel is disposed between the first layer and the high-k layer.

4. The structure of claim 1, wherein the channel, metal gate, spacers, source region and drain region are configured to define a multigate MOSFET.

5. The structure of claim 2, wherein the tensile strained channel comprises one of a biaxially strained Ge material and a uniaxially strained SiGe material.

6. The structure of claim 5, wherein the film has a lattice spacing that is smaller than the lattice spacing of the second crystalline material.

7. The structure of claim 2, further including:
   a upper wide bandgap layer between the tensile strained channel and the high-k dielectric Layers;
   a lower wide bandgap layer between the tensile strained channel and the substrate.

8. The structure of claim 2, wherein the capping layer comprises silicon.

9. The structure of claim 7, further including:
   a remote delta doped layer disposed between the upper wide bandgap spacer layer and the capping layer, or below the lower wide bandgap spacer layer, or both.

10. The structure of claim 1, wherein the substrate further comprises:
    a Si layer; and
    a graded relaxed III-V buffer layer on the Si layer;
    the first layer comprises a semi-insulating III-V epitaxially grown layer on the graded relaxed III-V buffer layer.

11. The structure of claim 2, wherein the III-V crystalline material is from one of the Al group, the Ga/As/In group and the Ga/P/In group.

12. The structure of claim 2, wherein the channel comprises a Ge material having a thickness below about 300 Angstrom.

13. The structure of claim 2, wherein the source region and the drain region both comprise a III-V semiconductor material.

14. A system comprising:
    an electronic assembly comprising:
       a transistor structure comprising:
          a substrate including a first layer comprising a first crystalline material;
          a tensile strained channel formed on a surface of the first layer and comprising a second crystalline material having a lattice spacing that is smaller than a lattice spacing of the first crystalline material;
          a capping layer formed on the tensile strained channel;
          a film formed over the capping layer to impart strain to the tensile strained channel;
          a metal gate on the capping layer;
          a pair of sidewall spacers on opposite sides of the metal gate; and
          a source region and a drain region on opposite sides of the metal gate adjacent a corresponding one of the sidewall spacers; and
    a main memory coupled to the transistor structure.

15. The system of claim 14, wherein the first crystalline material comprises a III-V crystalline material, and the second crystalline material comprises one of Ge and SiGe.

* * * * *